L. F. FULLER.

WIRELESS TELEGRAPHY.

APPLICATION FILED OCT. 30, 1916.

Reissued Nov. 25, 1919.

14,760.

WITNESSES:

J. B. Gardner

INVENTOR.
L. F. FULLER

BY White & Post

HIS ATTORNEYS

UNITED STATES PATENT OFFICE.

LEONARD F. FULLER, OF PALO ALTO, CALIFORNIA, ASSIGNOR TO FEDERAL TELEGRAPH COMPANY, OF SAN FRANCISCO, CALIFORNIA, A CORPORATION OF CALIFORNIA.

WIRELESS TELEGRAPHY.

14,760. Specification of Reissued Letters Patent. Reissued Nov. 25, 1919.

Original No. 1,179,353, dated April 11, 1916, Serial No. 762,475, filed April 21, 1913. Application for reissue filed October 30, 1916. Serial No. 128,406.

*To all whom it may concern:*

Be it known that I, LEONARD F. FULLER, a citizen of the United States, and a resident of Palo Alto, county of Santa Clara, State of California, have invented certain new and useful Improvements in Wireless Telegraphy, of which the following is a specification.

The invention relates to improvements in wireless telegraphy and especially to improvements in the transmitting circuit.

The object of the invention is to obtain a higher antenna current with a given input than has been heretofore obtained.

Another object of the invention is to reduce the resistance of the antenna circuit, thereby increasing the antenna current.

Another object of the invention is to provide means for obtaining sharper tuning than has been heretofore practical.

The invention possesses other advantageous features, which, with the foregoing will be set forth at length in the following description where I shall outline in full that form of the invention which I have selected for illustration in the drawings accompanying and forming part of the present specification. The novelty of the invention will be included in the claims succeeding said description. From this it will be apparent that I do not limit myself to the showing made by said drawings and description, as I may adopt many variations of the said invention as expressed in said claims.

Referring to said drawings.

Figure 2:
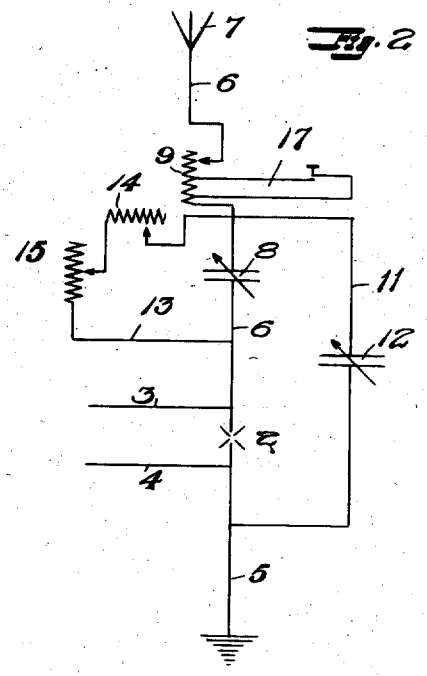
Fig. 2 is a diagrammatic representation of a modified form of the circuit.

In wireless telegraphy transmitting circuits, a certain amount of energy is not radiated because of the $I^2R$ losses of the source of oscillations. For a given input, a much smaller amount of power is produced in the antenna. By the use of my invention these $I^2R$ losses are greatly reduced and the resistance of the antenna circuit is reduced, with the result that a much higher antenna current is obtained.

The source of oscillations is shown in the present instance as an arc 2, to which power is supplied by the conductors 3—4 connected to any suitable source of power. In the forms of the invention shown in Figs. 1 and 2, one side of the arc is grounded by the conductor 5. Connected to the other side of the arc is a conductor 6 connected to the antenna 7 and including in circuit in series a capacity, preferably in the form of a variable condenser 8 and a variable inductance 9. Shunted around the variable condenser 8 and the arc 2 is a circuit 11 containing a capacity, preferably in the form of a variable condenser 12. The condenser 8 may be arranged as shown in conductor 6, or it may be placed in conductor 5 between the arc and the point of connection of circuit 11, or two condensers may be used, one in each of the positions stated. By proper adjustment of the shunt circuit capacity, a large percentage of the total antenna current will pass through the shunt circuit and the $I^2R$ losses of the arc are accordingly reduced. The capacities of the condensers to be employed depend upon the capacity of the antenna and on the conditions of operation, and are so adjusted to obtain the desired result. The shunt circuit is in no wise a circuit tuned to the antenna frequency, as its natural frequency of oscillation is usually of a higher value. In certain instances the value of condenser 8 approaches and reaches infinity and in those cases the condenser 8 may be omitted.

It is an important feature of this invention that the inductance and resistance of the shunt circuit 11 be kept a minimum, as otherwise the circulating currents through it will not be wattless, as is desired, but will have a power factor of appreciable value. In a circuit in which the arc is more or less unstable and inclined to set up several irregularly dispersed frequencies, this circuit will greatly reduce this tendency, increase the sharpness of tuning and put all of the radiated energy in one wave.

In employing this system in practice, using a 5 K. W. arc, and maintaining the capacities of the antenna and both condensers equal, I have obtained an increase of 50% in the antenna current, over the system in which the antenna current passed entirely through the arc. Using the same installation and doubling the capacity of the condenser 12, I have obtained 100 per cent. increase in the antenna current. The capacity of the condenser 12, however, has a certain maximum critical value above which it fails to aid in boosting the antenna current. Using a 50 K. W. arc I have obtained an increase in antenna power of 74 per cent. over the system in which the total antenna current passed through the arc. The efficiency of the system has been further increased by about 11 per cent., when the 50 K. W. arc was in use, by means of the circuits shown in Fig. 2 in which a circuit 13 containing resistance 14, preferably variable, and an inductance 15, preferably variable, is shunted around the condenser 8. If this circuit be tuned nearly into resonance with the oscillations in the main antenna it will have a very high reactive voltage drop across it and will, therefore, force a still greater per cent. of the antenna current through the shunt circuit 11.

Figure 1:
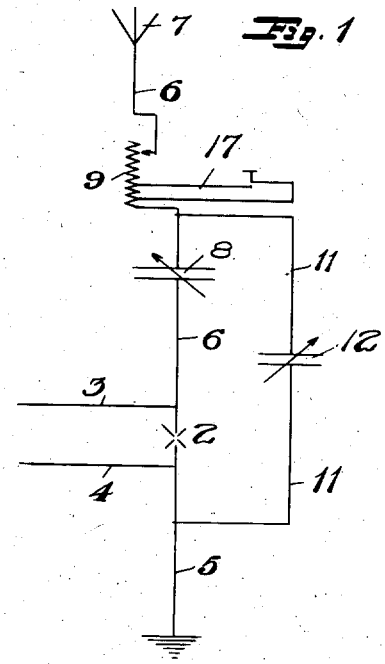
Figure 1 is a diagrammatic representation of one form of the transmitting circuit of my invention.

It should be noted that the circuit shown in Fig. 1 raises the antenna power by reducing the resistance of the antenna circuit while the circuits shown in Fig. 2 increase the antenna power by greatly reducing the energy losses in the arc.

Figure 3:
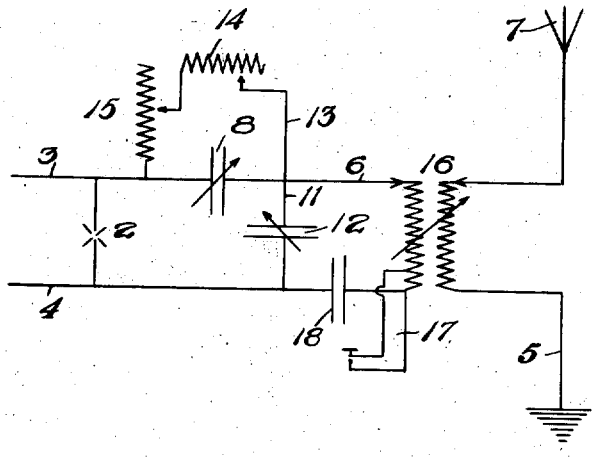
Fig. 3 is a diagrammatic representation of the closed circuit form of my invention.
Figure 4:
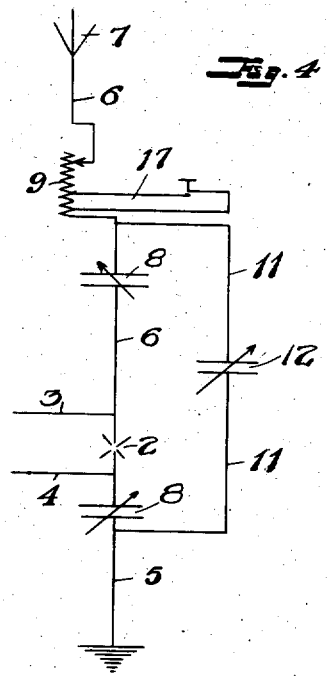
Fig. 4 is a diagrammatic representation of another modified form of the circuit.

The modification shown in Fig. 3 operates in the same manner as that shown in Fig. 2, with the exception that the arc circuit is inductively connected to the antenna circuit through the transformer 16, preferably variable, instead of being directly connected thereto. In this system a condenser 18 must be inserted in closed circuit, to produce the capacity effect of the antenna in the open circuits.

Signaling may be accomplished by varying the frequency or the wave length of the radiated oscillations, by varying the inductance in circuit. In the present instance I have shown a key circuit 17 adapted to shunt one or more turns of the inductance 9 or the primary of the transformer.

I claim:

1. In a transmission system for wireless telegraphy, a radiating system, a source of electrical oscillations, a capacity and a tuning inductance in series in said system, and a substantially inductionless circuit containing a capacity continuously shunting said first-named capacity and the source of oscillations.

2. In a transmission system for wireless telegraphy, a source of electrical oscillations, a radiating system associated therewith, a capacity in series with said source, and a substantially inductionless circuit containing a capacity continuously shunting said first-named capacity and said source.

3. In a transmission system for wireless telegraphy, a source of electrical oscillations, a radiating system associated therewith, an inductance and capacity in series with said source, a capacity continuously in shunt on said source and first-named capacity, and an inductance in shunt on said first-named capacity.

4. In a transmission system for wireless telegraphy, a source of electrical oscillations, a radiating system connected thereto, a capacity and inductance in said system, a circuit containing capacity continuously shunting said source and first-named capacity, and a circuit containing inductance and resistance in shunt on said first-named capacity.

5. In a transmission system for wireless telegraphy, an arc, a radiating system associated therewith, a capacity and inductance in series in said system, a circuit containing capacity continuously shunted around said arc and the first-named capacity, and a circuit containing resistance and inductance shunted around said first-named capacity.

6. In a transmission system for wireless telegraphy, a source of electrical oscillations, a radiating system associated therewith, an inductance and capacity in series with said source, and a circuit shunted on said capacity and source, the impedance of said shunt circuit being less than the impedance of the circuit shunted.

7. In a transmission system for wireless telegraphy, a source of electrical oscillations, a radiating system associated therewith, an inductance and capacity in series with said source, a circuit containing capacity in shunt on said source and first-named capacity, and a circuit containing resistance and inductance shunted around said first-named capacity, the last shunt circuit being nearly in resonance with the oscillations in the radiating system.

8. In a transmission system for wireless telegraphy, a radiating system, a source of electrical oscillations, a capacity and inductance in series in said system, a substantially inductionless circuit containing a capacity continuously shunting said first-named capacity and source of oscillations and means for varying said inductance.

9. In a transmission system for wireless telegraphy, a source of electrical oscillations of high frequency, a conductor connecting one side of the source to earth, a radiating system connected to the other side of said source, and a substantially inductionless circuit containing capacity, continuously shunting said source and serving to produce a low resistance return circuit for the electrical oscillations from the radiating system.

10. In a transmission system for wireless telegraphy, an electric arc for producing electrical oscillations of high frequency, a conductor connecting one side of the arc to earth, a radiating system connected to the other side of the arc and a substantially inductionless circuit containing capacity and having less impedance than the arc continuously shunting said arc for the purpose of boosting the radiating system current by shunting a portion of said current around the arc to earth, and thus decreasing the energy losses in the arc.

LEONARD F. FULLER.